United States Patent [19]
Boardman et al.

[11] Patent Number: 5,196,357
[45] Date of Patent: Mar. 23, 1993

[54] METHOD OF MAKING EXTENDED POLYSILICON SELF-ALIGNED GATE OVERLAPPED LIGHTLY DOPED DRAIN STRUCTURE FOR SUBMICRON TRANSISTOR

[75] Inventors: William J. Boardman, San Jose; Ying T. Loh, Saratoga; Edward D. Nowak, Pleasanton; Chung S. Wang, Fremont, all of Calif.

[73] Assignee: VLSI Technology, Inc., San Jose, Calif.

[21] Appl. No.: 793,916

[22] Filed: Nov. 18, 1991

[51] Int. Cl.$^5$ .............................................. H01L 21/70
[52] U.S. Cl. ...................................... 437/40; 437/41; 437/44; 437/162; 437/233; 437/933
[58] Field of Search ................ 437/40, 41, 44, 162, 437/228, 233, 235, 933; 357/23.3

[56] References Cited

U.S. PATENT DOCUMENTS

| | | | |
|---|---|---|---|
| 4,041,518 | 8/1977 | Shiamizu et al. | 437/162 |
| 4,414,737 | 11/1983 | Menjo et al. | 437/162 |
| 4,419,810 | 12/1983 | Riseman | 437/162 |
| 4,471,522 | 9/1984 | Jambotkar | 437/162 |
| 4,753,709 | 6/1988 | Welch et al. | 437/200 |
| 4,845,046 | 9/1989 | Shimbo | 437/162 |
| 4,939,154 | 7/1990 | Shimbo | 437/44 |
| 5,008,209 | 4/1991 | Appels et al. | 437/44 |

FOREIGN PATENT DOCUMENTS 0154967 12/1979 Japan .
0032168 2/1984 Japan .

OTHER PUBLICATIONS

J. E. Moon, et al., "A New LDD Structure: Total Overlap with Polysilicon Spacer (TOPS)", IEEE Electronic Device Letters, May 1990, pp. 221–223.

T. Y. Huang: "A novel SubMicron LDD Transistor with Inverse-T Gate Structure", IEDM, 1986, pp. 742–745.

R. Izawa, et al., "The Impact of Gate-Drain Overlapped LDD (GOLD) For Deep SubMicron VLSIs", IEDM 1987, pp. 38–41.

Primary Examiner—Tom Thomas
Attorney, Agent, or Firm—Douglas L. Weller

[57] ABSTRACT

For a structure with an overlapping gate region, a first insulator layer is placed on a substrate. A source/drain polysilicon layer is placed on the insulator layer. The source/drain polysilicon layer is doped with atoms of a first conductivity type. A second insulator layer is placed on the source/drain polysilicon layer. A gap is etched in the second insulator layer and the source/drain polysilicon layer to expose a portion of the first insulator layer. The exposed portion of the first insulator layer and an additional amount of the first insulator layer under the second insulator is etched so as to enlarge the gap and to undercut a portion of the source/drain polysilicon layer. Two polysilicon filler regions are formed which fill a portion of the gap including the undercut area under the source/drain polysilicon layer. A gate polysilicon region is formed in the gap and extends over the source/drain polysilicon layer. The gate polysilicon region is separated from the source/drain polysilicon layer and the polysilicon filler regions by a dielectric region. Source/drain regions are formed by atoms in the source/drain polysilicon layer diffusing through the polysilicon filler regions into the substrate.

20 Claims, 5 Drawing Sheets

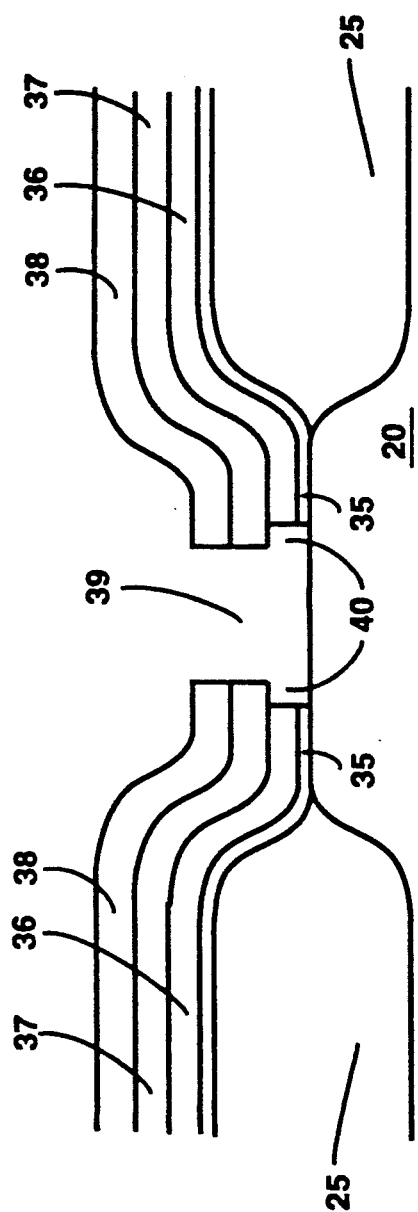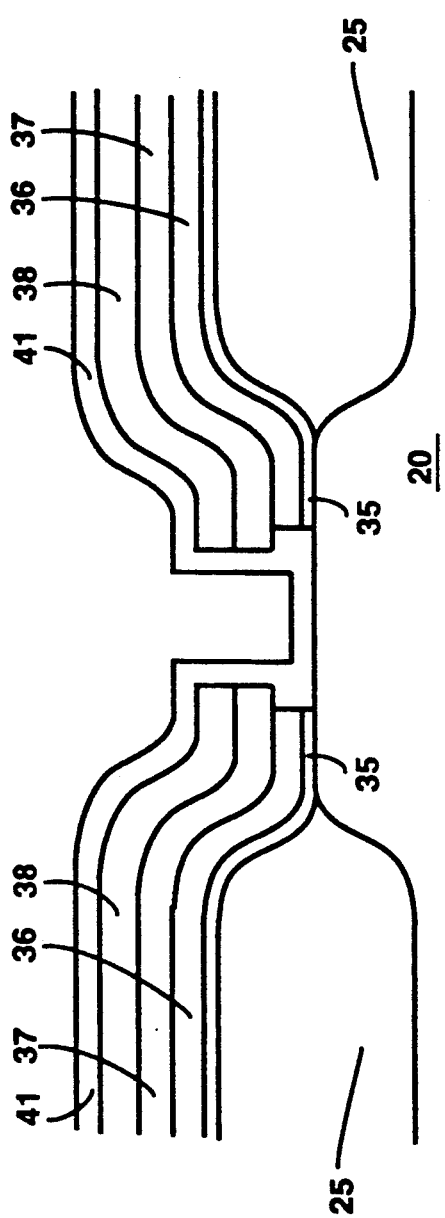

METHOD OF MAKING EXTENDED POLYSILICON SELF-ALIGNED GATE OVERLAPPED LIGHTLY DOPED DRAIN STRUCTURE FOR SUBMICRON TRANSISTOR

BACKGROUND

The present invention concerns a gate overlapped lightly doped drain (GOLDD) process for use in producing high reliability submicron metal oxide silicon field effect transistors (MOSFETs).

The use of GOLDD processes for high speed reliable submicron MOSFETs has been investigated. For example, in one process, referred to as total overlap with polysilicon spacer (TOPS), three deposits of polysilicon are use to form a gate region of a transistor which overlaps the source and drain region of the transistor. See J.E. Moon, et al., *A New LDD Structure: Total Overlap with Polysilicon Spacer (TOPS)*, IEEE Electronic Device Letters May 1990 pp. 221-223. See also T.Y Huang: *A novel SubMicron LDD Transistor with Inverse-T Gate Structure*, IEDM, 1986, pp. 742-745, and R. Izawa, et. al., *The Impact of Gate-Drain Overlapped LDD(GOLD) For Deep SubMicron VLSIs*, IEDM 1987, pp. 38-41.

The presence of an overlapping gate in submicron processing of MOSFETs has several advantages. For example, devices which use overlapping gates show improvements in performance and reliability. Further, such devices have shown a smaller sensitivity to n$^-$ dose variations. However, existing GOLDD processes are complex and not suitable for use in a volume production environment. For example, the three polysilicon depositions required for the TOPS process makes the process impractical for use in manufacturing VLSI circuits. It is desirable, therefore, to develop methods to produce MOSFETs using GOLDD processes which are also suitable for use in a manufacturing environment.

SUMMARY OF THE INVENTION

In accordance with the preferred embodiment of the present invention, a method is presented for producing a structure with an overlapping gate region. A first insulator layer is placed on a substrate. For example, the first insulator layer is a layer of nitride over a layer of pad oxide. A source/drain polysilicon layer is placed on the insulator layer. The source/drain polysilicon layer is doped with atoms of a first conductivity type. For example, for an n-channel device, the source/drain polysilicon layer is doped with Arsenic atoms and Phosphorus atoms. For a p-channel device, the source/drain polysilicon layer may be doped with Boron.

A second insulator layer is placed on the source/drain polysilicon layer. A gap is etched in the second insulator layer and the source/drain polysilicon layer to expose a portion of the first insulator layer. The exposed portion of the first insulator layer and an additional amount of the first insulator layer under the second insulator is etched so as to enlarge the gap and to cut under a portion of the source/drain polysilicon layer. Two polysilicon filler regions are formed which fill a portion of the gap including the undercut area under the source/drain polysilicon layer. The polysilicon filler regions are formed, for example, by depositing a thin layer of polysilicon which fills the portion of the gap under the source/drain polysilicon layer. A etchback is then performed on the thin layer of polysilicon to form the polysilicon filler regions. A gate region is formed in the gap and extends over the source/drain polysilicon layer. The gate region is separated from the polysilicon filler regions and the substrate by a dielectric region.

In the preferred embodiment of the present invention, source/drain regions are formed by atoms in the source/drain polysilicon layer diffusing through the polysilicon filler region into the substrate. For example, in an n-channel device, some of the Phosphorus atoms diffuse through the polysilicon filler regions to the substrate forming two n$^-$ low density source/drain regions. Similarly, some of the Arsenic atoms diffuse through the polysilicon filler regions to the substrate forming two n$^+$ source/drain regions.

In the preferred embodiment, portions of the source/drain polysilicon layer function as extended electrodes. Therefore, portions of the second insulator layer not covered by the gate region are removed to expose portions of the source/drain polysilicon layer. Then, a metal-silicide layer is formed on the exposed portions of the source/drain polysilicon layer. This may be done, for example, by depositing a metal layer, annealing the metal layer to produce a self-aligning silicidation of the metal with the polysilicon, and removing unreacted portions of the metal layer. Once the metal-silicide layer has been formed, a third insulating layer is deposited. Contact holes are etched through the third insulating layer to the metal-silicide layer. A metal layer is then connected to the metal-silicide layer through the contact holes.

The present invention has several advantages over the prior art. For example, the use of the metal-silicide for connection to the source/drain results in low source/drain sheet resistance and low contact resistance. Further, the use of an extended electrode over the field oxide regions allows the source/drain region to be reduced in size, prevents plasma etch damage to the junction and provides better junction performance with respect to breakdown and leakage. Also, in the present invention there is no heavy dosage implant to the substrate to form source/drain junction regions. This results in an improved break down voltage (BV) and less leakage through the substrate. Also, the reduction in size of the active source/drain regions result in low source/drain junction capacitance. In addition, the present invention allows the achievement of a very short channel gate length.

BRIEF DESCRIPTION OF THE DRAWINGS

FIG. 2 through FIG. 8 illustrate a method for producing a gate overlapped lightly doped drain MOSFET in accordance with the preferred embodiment of the present invention.

DESCRIPTION OF THE PRIOR ART

Figure 1:
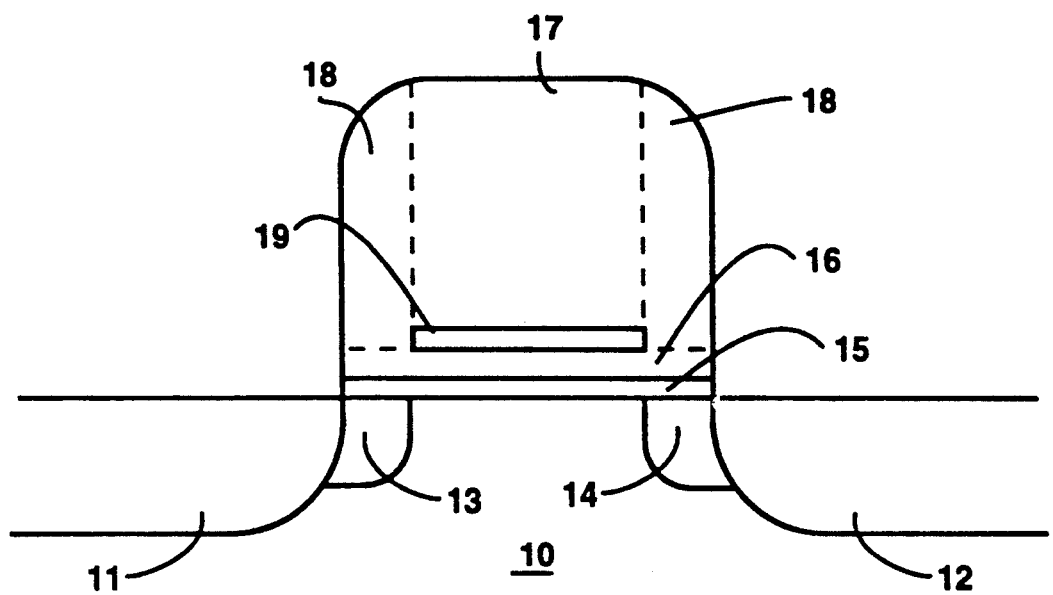
FIG. 1 illustrates a prior art process in which three polysilicon deposits are used to produce a gate overlapped lightly doped drain MOSFET.

FIG. 1 shows a structure resulting from a prior art TOPS process. Within a substrate 10 is implanted an n$^+$ region 11, an n$^+$ region 12, an n$^-$ region 13 and an n$^-$ region 14. A gate region is placed on top of an oxide layer 15. Oxide layer 15 is on top of substrate 10. The gate region was constructed using a first polysilicon deposition to form a polysilicon region 16, a second polysilicon deposition to form a polysilicon region 17 and a third polysilicon deposition to form a polysilicon region 18. A thin oxide region 19 is buried within the gate region as shown.

The shown structure has improved performance and reliability over oxide spacer lightly doped drain devices (LDD). Further, devices using the above-described structure have shown a smaller sensitivity to n− dose variations. However, as discussed above, in the TOPS process, three deposits of polysilicon are use to form the gate region. The three polysilicon depositions makes the process impractical for use in manufacturing VLSI circuits.

DESCRIPTION OF THE PREFERRED EMBODIMENT

FIG. 2 through FIG. 8 illustrate a method for producing a gate overlapped lightly doped drain MOSFET in accordance with the preferred embodiment of the present invention.

Figure 2:
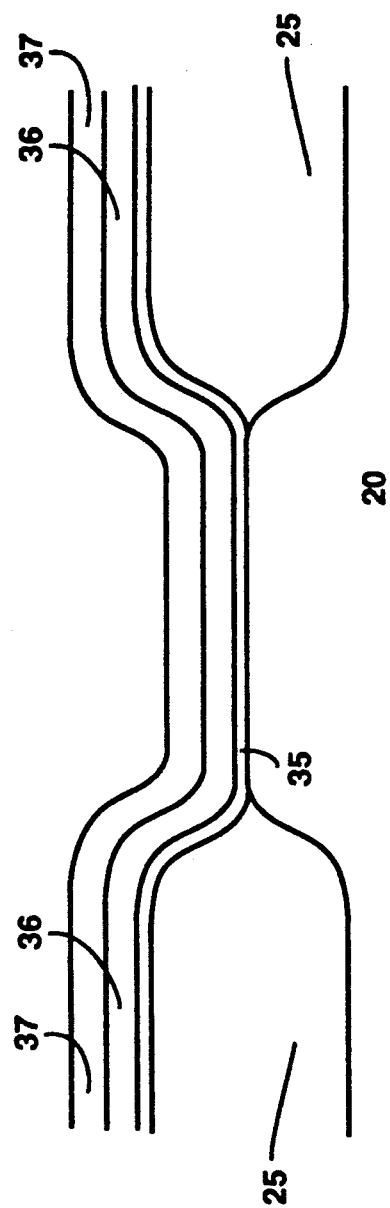

The structure shown in FIG. 2 is formed in a well 20 of first conductivity type within a substrate. For example, the substrate may be of p-type material doped with $10^{15}$ atoms per cubic centimeter. Alternately, the substrate may be of n-type material. A typical depth of the substrate is 500 microns. Well 20 may be, for example, of p-type material doped with $10^{16}$ atoms per cubic centimeter. Alternately, well 20 may be of n-type material doped with $10^{16}$ atoms per cubic centimeter.

A local oxidation of silicon (LOCOS) process or other process is used to form an insulating layer 25 of, for example, field oxide on the substrate as shown. For example, in a LOCOS process, a layer of pad oxide is formed. On top of the pad oxide, a layer of nitride is deposited. The nitride is patterned and etched. Field oxide is grown on the substrate at places where the nitride has been etched to expose the substrate. The nitride and pad oxide are then removed.

After insulating layer 25 is formed, a pad oxide layer 35 is placed (i.e. grown or deposited). For example, pad oxide layer 35 is approximately 300 Å thickness. On top of pad oxide layer 35 is deposited a nitride layer 36. For example, nitride layer 36 is approximately 1000 Å thick. On top of nitride layer 36 is deposited a source/drain polysilicon layer 37. Source/drain polysilicon layer 37 is used to form source/drain electrodes. For example, source/drain polysilicon layer 37 is deposited using a low pressure chemical vapor deposition (LPCVD) process and has a thickness of approximately 2000 Å. Source/drain polysilicon layer 37 will be used as an extended electrode for source/drain regions of the completed circuit. For an n-channel device, source/drain polysilicon layer 37 is implanted with, for example, Arsenic followed by an implant of Phosphorus. Some of the implanted Phosphorus atoms will later be diffused out to form n− lightly doped source/drain regions in well 20. Some of the implanted Arsenic atoms will later be diffused out to form n+ source/drain contact regions in well 20. Similarly, for a p-channel device, source/drain polysilicon layer 37 is implanted with, for example, BF$_2$ or Boron atoms. The resulting structure is shown in FIG. 2.

Figure 3:
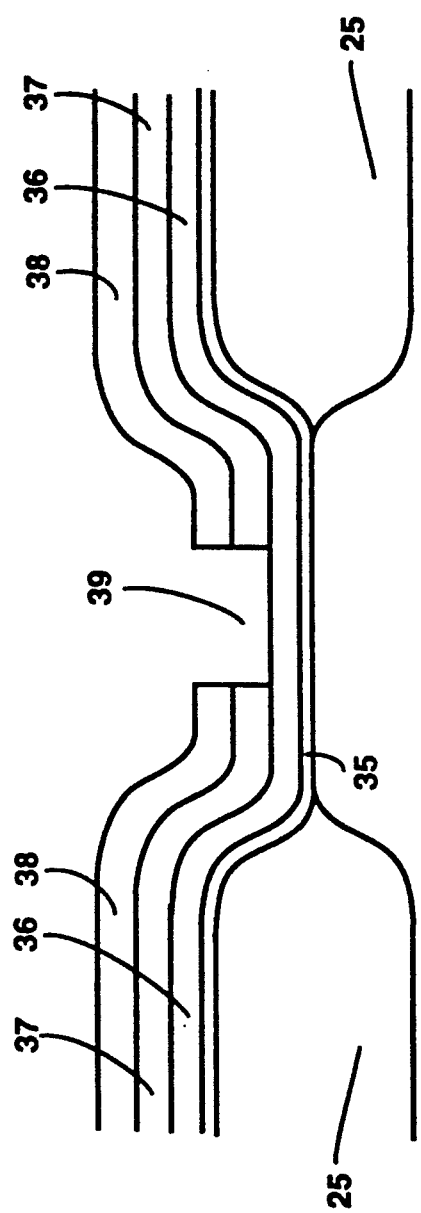

As shown in FIG. 3, an oxide layer 38 is deposited on source/drain polysilicon layer 37. For example, oxide layer 38 is 3000 Å thick. After masking, a reactive ion etch process is used to etch through oxide layer 38 and source/drain polysilicon layer 37. A gap 39 separates the etched portions of source/drain polysilicon layer 37 and oxide layer 38. The width of gap 39 defines the length of channel region in well 20. For example, gap 39 is approximately 0.5 microns wide.

As shown in FIG. 4, a wet etch of nitride layer 36 and pad oxide layer 35 is performed. For example the wet etchants used are H$_3$PO$_4$ for nitride layer 36 and buffered HF for oxide layer 38. The wet etch will etch away a portion of nitride layer 36 and oxide layer 35 and result in undercut regions 40 extending under source/drain polysilicon layer 37. The area of undercut regions 40 under source/drain polysilicon layer 37 defines source and drain junction areas in well 20. For example, regions 40 extend 0.1 microns under source/drain polysilicon layer 37.

As shown in FIG. 5, a thin polysilicon layer 41 is deposited over oxide layer 38 and into gap 39, for example by a low pressure CVD process. For example, polysilicon layer 41 is 0.1 micron thick. Polysilicon layer 41 will fill undercut regions 41 as shown and provide connection between source/drain polysilicon layer 37 and well 20.

Figure 6:
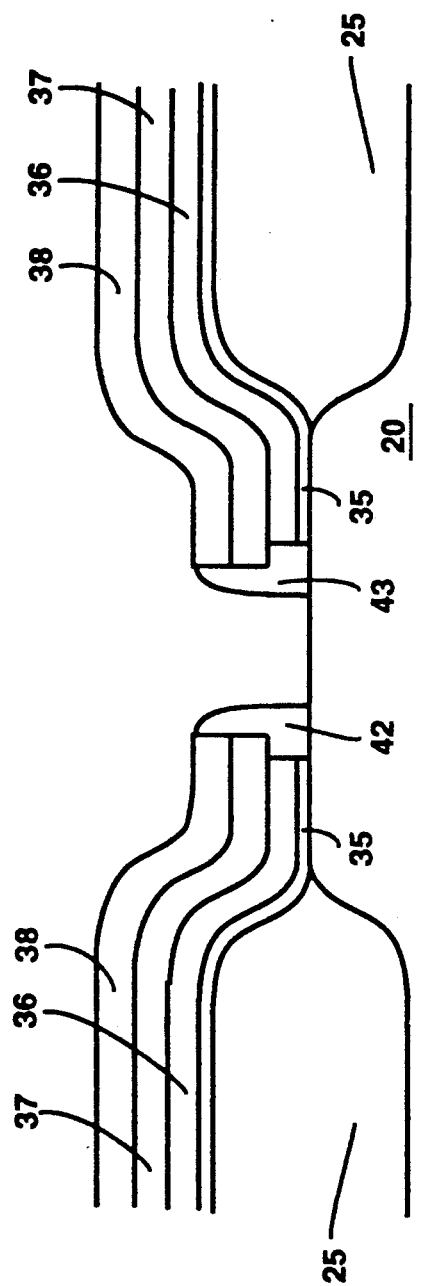

As shown in FIG. 6, a reactive ion etch is performed to etch back polysilicon layer 41, leaving only polysilicon filler region 42 and polysilicon filler region 43 to connect source/drain polysilicon layer 37 and well 20. The distance between polysilicon filler region 42 and polysilicon filler region 43 defines the channel gate length. The channel gate length is controlled by the width of gap 39, and the thickness of polysilicon layer 41. For example, when gap 39 is 0.5 microns and polysilicon layer 41 is 0.1 micron thick, it is possible to achieve a channel gate length of 0.3 microns.

To adjust the threshold voltage of the completed device, an implant of boron with $10^{12}$ atoms per square centimeter is performed. In order to protect the surface of the substrate, a layer of sacrificial oxide, for example 250 Å thick, may be grown before performing the implant. After the implant the layer of sacrificial oxide may be dipped off using buffered HF.

Figure 7:
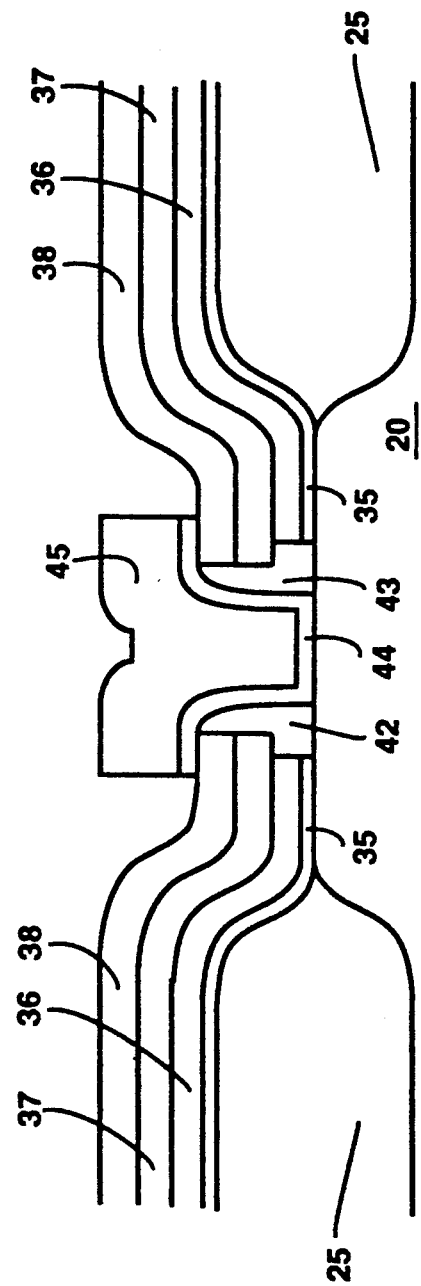

As shown in FIG. 7, a gate oxide layer is formed, for example by thermal oxidation. The gate oxide layer is, for example, 100 Å thick. On top of the gate oxide layer is deposited a gate polysilicon layer. The gate polysilicon layer is doped to approximately $10^{20}$ atoms per cubic centimeter using for example POCl$_3$ or a Phosphorus implant. A mask and reactive ion etch is used to define gate oxide region 44 and polysilicon gate region 45. Polysilicon gate region 45 overlaps source/drain polysilicon layer 37 and oxide layer 38, for example by 0.5 microns. The gate overlap capacitance is defined by the thickness of gate oxide region 44 and oxide layer 38.

Figure 8:
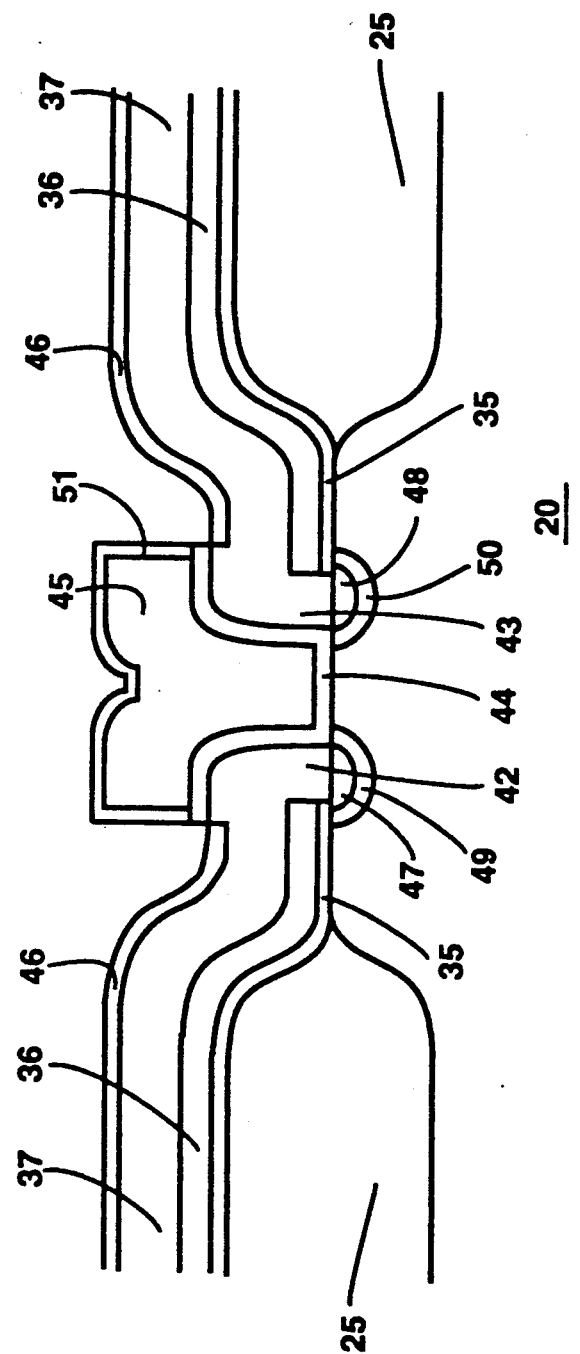

As shown in FIG. 8, the exposed portion of oxide layer 38 is removed by a dip in buffered HF. During thermal oxidation to form gate oxide layer 44, or if necessary, during an additional thermal anneal step, the doped atoms out diffuse from source/drain polysilicon layer 37, through polysilicon filler regions 42 and 43 into well 20 to form lightly doped source/drain regions 49 and 50 and heavily doped source/drain regions 47 and 48. For example, for an n-channel device, Phosphorus and Arsenic atoms out diffuse to form n− regions 49 and 50 and n+ regions 47 and 48. For a p-channel device, Boron atoms out diffuse to form heavily doped p+ regions 47 and 48. The width and depth of source/drain regions 47, 48, 49 and 50 are controlled by the length undercut regions 40 extend under polysilicon layer 37, the thickness of polysilicon layer 41 and the time and temperature used in oxidation of gate oxide layer 44. For example, when polysilicon layer 41 is 0.1 microns thick, regions 40 extend 0.1 micron under source/drain polysilicon layer 37 and gate oxide layer 44 is 100 Å thick, lightly doped n⁻ source/drain regions 49 and 50, extend a depth of 0.15 microns below the substrate surface and are 0.25 microns in width. Similarly, heavily doped n⁺ regions 47 and 48 extend a depth of 0.1 micron below the substrate surface and are 0.2 microns in width.

A metal layer, for example Titanium (Ti), is deposited. Alternately, the metal layer may consist of another metal such as, for example, Molybdenum (Mo), Chromium (Cr), Nickel (Ni), Platinum (Pt), Cobalt (Co), or Tantalum (Ta). The metal layer is for example, 1000 Å thick. The metal is annealed. For example a rapid thermal anneal is performed at 700 degrees Celsius for 20 seconds. The metal layer reacts with polysilicon gate region 45 to form a metal silicide layer 51. Additionally the metal layer reacts with exposed portions of source/drain polysilicon layer 37 to form a metal-silicide layer 46.

An insulating layer is placed over the substrate. For example, Boron Phosphorus silicate glass (BPSG) and TEOS are used.

The insulating layer is masked and etched to form contact holes through to metal silicide layer 46 and to metal silicide layer 51. The contact holes to metal silicide layer 46 are out over insulators regions 25. A metal layer is then deposited in contact with metal-silicide layer 46 and metal silicide layer 51 through the contact holes.

The present invention has several advantages over the prior art processes. For example, the present invention provides for a method which is simple, practical and fully compatible with current VLSI processes. The present invention utilizes self-aligned silicidation to produce a GOLDD structure which has a low gate resistance. Further, the use of an extended electrode over the field oxide regions allows the source/drain region to be reduced in size, prevents plasma etch damage to the source/drain junctions and provides better junction performance with respect to breakdown and leakage.

Also, in the present invention there is no heavy implant to source/drain region 49 or source/drain region 50. This results in an improved break down voltage (BV) and less leakage through the substrate. The use of the metal-silicide for connection to the source/drain results in low source/drain sheet resistance and low contact resistance. Also, the reduction in size, the shallowness of the active source/drain region 49 and source/drain region 50 and extreme shallowness of source/drain contact region 47 and source/drain contact region 48 result in low source/drain junction capacitance.

In addition, the present invention allows a very short channel gate length to be achieved. Varying the thickness of polysilicon layer 41 to reduce the polysilicon gate length, the polysilicon gate length can be reduced to narrower than the minimum feature size of currently achievable using currently available photolithographic equipment.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for producing a structure with an overlapping gate region, the method comprising the steps of:
    (a) forming a first insulator layer on a substrate;
    (b) forming a source-drain polysilicon layer on the insulator layer;
    (c) doping the source-drain polysilicon layer with atoms of a first conductivity type;
    (d) forming a second insulator layer on the source-drain polysilicon layer;
    (e) creating a gap in the second insulator layer and the source/drain polysilicon layer to expose a portion of the first insulator layer;
    (f) removing the exposed portion of the first insulator layer and an additional amount of the first insulator layer under the second insulator so as to enlarge the gap created in step (e) and to undercut a portion of the source/drain polysilicon layer;
    (g) forming polysilicon filler regions which fill a portion of the gap created in step (e), the filled portion of the gap including area under the source/drain polysilicon layer undercut by the removing in step (f);
    (h) thermally annealing the source-drain polysilicon layer and the polysilicon filler regions to cause some of the atoms used to dope the source/drain polysilicon layer in step (c) to diffuse through the polysilicon filler regions to the substrate to form two source/drain regions within the substrate; and,
    (i) forming a gate region in the gap and extending over the source/drain polysilicon layer, the gate region being separated from the polysilicon filler regions and the substrate by a dielectric region.

2. A method as in claim 1 wherein the first insulator layer comprises a layer of nitride over a layer of pad oxide.

3. A method as in claim 1 wherein step (g) comprises the substeps of:
    (g.1) depositing a thin layer of polysilicon; and,
    (g.2) performing a reactive ion etch on the thin layer of polysilicon to form the polysilicon filler regions.

4. A method as in claim 1 wherein after step (g) the following steps are performed:
    (g.1) forming a layer of sacrificial oxidation over exposed portions of the substrate;
    (g.2) performing an implant of atoms through the layer of sacrificial oxide; and,
    (g.3) removing the layer of sacrificial oxidation.

5. A method as in claim 1 wherein the step (c), the source/drain polysilicon layer is doped with Boron atoms and wherein in step (h), some of the Boron atoms diffuse through the polysilicon filler regions to the substrate forming two p⁺ source/drain regions.

6. A method as in claim 1 wherein step (f) includes performing a wet etch to control amount of the undercut portion of the source/drain polysilicon layer.

7. A method as in claim 6 wherein step (a) includes forming a first sub-layer of oxide and forming a second sub-layer of nitride over the first sub-layer of oxide.

8. A method as in claim 7 wherein the wet etch in step (f) is performed using $H_3PO_4$ to etch the second sub-layer of nitride and buffered HF to etch the first sub-layer of oxide.

9. A method as in claim 1 wherein in step (c), the source/drain polysilicon layer is doped with first atoms of a first element and second atoms of a second element and wherein in step (h), some of the second atoms diffuse through the polysilicon filler regions to the substrate forming two low density source/drain regions, and some of the first atoms diffuse through the polysilicon filler regions to the substrate forming two higher density source/drain regions.

10. A method as in claim 9 wherein the first atoms are Arsenic and the second atoms are Phosphorus.

11. A method as in claim 1 wherein step (h) occurs during formation of the dielectric region.

12. A method for producing a structure with an overlapping gate region, the method comprising the steps of:
(a) forming a first insulator layer on a substrate;
(b) forming a source/drain polysilicon layer on the insulator layer;
(c) doping the source/drain polysilicon layer with atoms of a first conductivity type;
(d) forming a second insulator layer on the source/drain polysilicon layer;
(e) creating a gap in the second insulator layer and the source/drain polysilicon layer to expose a portion of the first insulator layer;
(f) removing the exposed portion of the first insulator layer and an additional amount of the first insulator layer under the second insulator so as to enlarge the gap created in step (e) and to undercut a portion of the source/drain polysilicon layer;
(g) forming polysilicon filler regions which fill a portion of the gap created in step (e), the filled portion of the gap including area under the source/drain polysilicon layer undercut by the removing in step (f); and,
(h) forming a gate region in the gap and extending over the source/drain polysilicon layer, the gate region being separated from the polysilicon filler regions and the substrate by a dielectric region;
(i) removing portions of the second insulator layer not covered by the gate region to expose portions of the source/drain polysilicon layer; and,
(j) forming a metal-silicide layer on the exposed portions of the source/drain polysilicon layer.

13. A method as in claim 12 additionally comprising the steps of:
(k) depositing a third insulating layer;
(l) etching contact holes through the third insulating layer to the metal-silicide layer; and,
(m) connecting a metal layer to the metal-silicide layer through the contact holes etched in step (1).

14. A method as in claim 12 wherein step (f) includes performing a wet etch to control amount of the undercut portion of the source/drain polysilicon layer.

15. A method as in claim 14 wherein the wet etch in step (f) is performed using $H_3PO_4$ and HF.

16. A method as in claim 12 wherein step (c), the source/drain polysilicon layer is doped with first atoms of a first type and second atoms of a second type and wherein after step (g), some of the second atoms diffuse through the polysilicon filler regions to the substrate forming two low density source/drain regions, and some of the first atoms diffuse through the polysilicon filler regions to the substrate forming two higher density source/drain regions.

17. A method as in claim 16 wherein the first atoms are Arsenic and the second atoms are Phosphorus.

18. A method as in claim 12 additionally comprising the following step, performed after step (g):
thermally annealing the source/drain polysilicon layer and the polysilicon filler regions to cause some of the atoms used to dope the source/drain polysilicon layer in step (c) to diffuse through the polysilicon filler regions to the substrate to form two source/drain regions within the substrate.

19. A method as in claim 18 wherein the step of thermally annealing the source/drain polysilicon layer and the polysilicon filler regions occurs during formation of the dielectric region.

20. A method for producing a structure with an overlapping gate region, the method comprising the steps of:
(a) forming a first insulator layer on a substrate;
(b) forming a source/drain polysilicon layer on the insulator layer;
(c) doping the source/drain polysilicon layer with atoms of a first conductivity type wherein the source/drain polysilicon layer is doped with Arsenic atoms and Phosphorus atoms;
(d) forming a second insulator layer on the source/drain polysilicon layer;
(e) creating a gap in the second insulator layer and the source/drain polysilicon layer to expose a portion of the first insulator layer;
(f) removing the exposed portion of the first insulator layer and an additional amount of the first insulator layer under the second insulator so as to enlarge the gap created in step (e) and to undercut a portion of the source/drain polysilicon layer;
(g) forming polysilicon filler regions which fill a portion of the gap created in step (e), the filled portion of the gap including area under the source/drain polysilicon layer undercut by the removing in step (f); and,
(h) forming a gate region in the gap and extending over the source/drain polysilicon layer, the gate region being separated from the polysilicon filler regions and the substrate by a dielectric region;
wherein after step (g), some of the Phosphorus atoms diffuse through the polysilicon filler regions to the substrate forming two n− low density source/drain regions, and some of the Arsenic atoms diffuse through the polysilicon filler regions to the substrate forming two n+ source/drain regions.

* * * * *